(12) United States Patent
Wang et al.

(10) Patent No.: US 12,151,279 B2
(45) Date of Patent: Nov. 26, 2024

(54) MICROCHANNEL HEAT SINK AND METHOD OF MANUFACTURING THE SAME

(71) Applicant: FOSHAN HUAZHI ADVANCED MATERIALS CO., LTD., Guangdong (CN)

(72) Inventors: Zheng Wang, Guangdong (CN); Wenzhen Ma, Guangdong (CN); Zhiheng Li, Guangdong (CN)

(73) Assignee: FOSHAN HUAZHI ADVANCED MATERIALS CO., LTD., Foshan (CN)

( * ) Notice: Subject to any disclaimer, the term of this patent is extended or adjusted under 35 U.S.C. 154(b) by 224 days.

(21) Appl. No.: 17/788,917

(22) PCT Filed: Oct. 15, 2021

(86) PCT No.: PCT/CN2021/124091
§ 371 (c)(1),
(2) Date: Jun. 24, 2022

(87) PCT Pub. No.: WO2022/267268
PCT Pub. Date: Dec. 29, 2022

(65) Prior Publication Data
US 2023/0226590 A1  Jul. 20, 2023

(30) Foreign Application Priority Data

Jun. 25, 2021 (CN) .......................... 202110708719.0

(51) Int. Cl.
*B23K 20/02* (2006.01)
*B21D 37/16* (2006.01)
(Continued)

(52) U.S. Cl.
CPC ............. *B21D 53/04* (2013.01); *B21D 37/16* (2013.01); *B23K 20/023* (2013.01); *H05K 7/2039* (2013.01); *B23K 2101/14* (2018.08)

(58) Field of Classification Search
CPC .. B23K 20/02; B23K 20/023; B23K 2101/14; F28F 2275/061; H01L 23/473; B21D 37/16; B21D 53/04
See application file for complete search history.

(56) References Cited

U.S. PATENT DOCUMENTS 4,046,305 A  *  9/1977  Brown ................. B23K 35/002
228/198
2007/0084585 A1 *  4/2007  Takagi .................. H01L 23/473
257/E23.098

(Continued)

FOREIGN PATENT DOCUMENTS

CN       103269786 A      8/2013
CN       204012181 U     12/2014
(Continued)

OTHER PUBLICATIONS

Chinese Patent Office: Office Action of CN 202110708719.0 (related application); Feb. 23, 2022; 9 pages.

(Continued)

*Primary Examiner* — Eric S Ruppert (57) ABSTRACT

The apresnt disclosure adopts the thermal bonding process to process the microchannel heat sink. By placing the upper cover plate and the lower cover plate on the plates of the microchannel heat sink, the pressure is directly applied, and there is no need to add other adhesives.

11 Claims, 3 Drawing Sheets

(51) Int. Cl.
    *B21D 53/04*     (2006.01)
    *H05K 7/20*     (2006.01)
    *B23K 101/14*     (2006.01)

(56) References Cited

U.S. PATENT DOCUMENTS

| | | | |
|---|---|---|---|
| 2007/0157469 | A1 | 7/2007 | Schulz-Harder |
| 2007/0165190 | A1* | 7/2007 | Takagi .............. G03B 21/145 |
| | | | 257/E23.098 |
| 2015/0083369 | A1* | 3/2015 | Fryer .................. F28F 19/06 |
| | | | 216/33 |
| 2017/0172012 | A1 | 6/2017 | Lin et al. |

FOREIGN PATENT DOCUMENTS

| | | | |
|---|---|---|---|
| CN | 104347429 | A | 2/2015 |
| CN | 104874932 | A | 9/2015 |
| CN | 105244756 | A | 1/2016 |
| CN | 107160019 | A | 9/2017 |
| CN | 107275297 | A | 10/2017 |
| CN | 206657955 | U | 11/2017 |
| CN | 110729259 | A | 1/2020 |
| CN | 212328253 | U | 1/2021 |
| DE | 102012025495 | A1 | 7/2014 |
| JP | 2003279283 | A | 10/2003 |
| JP | 2006253702 | A | 9/2006 |
| JP | 2007127398 | A | 5/2007 |
| JP | 2008300596 | A | 12/2008 |
| JP | 2012160688 | A | 8/2012 |
| JP | 2016063145 | A | 4/2016 |
| JP | 2021063637 | A | 4/2021 |
| JP | 2022527757 | A | 6/2022 |
| KR | 20110122906 | A | 11/2011 |

OTHER PUBLICATIONS

Patent Cooperation Treaty: International Search Report of PCT/CN2021/124091; Dec. 30, 2021; 9 pages.
Korean Patent Office; Korean Office Action Related Application No. 9-5-2023-040541702; dated May 1, 2023; 5 pages.
European Patent Office: Extended European Search Report of EP 21890364.9; Seiderer, Jens; Oct. 26, 2023; 8 pages.
Japanese Patent Office: Japanese Notice of Allowance of JP Patent Application on No. 2022-527757 (related application); Aug. 22, 2023; 3 pages.

* cited by examiner

MICROCHANNEL HEAT SINK AND METHOD OF MANUFACTURING THE SAME

CROSS-REFERENCE TO RELATED APPLICATIONS

This application is a U.S. National Phase application submitted under 35 U.S.C. § 371 of Patent Cooperation Treaty application serial no. PCT/CN2021/124091, filed Oct. 15, 2021, and entitled MICROCHANNEL HEAT SINK AND METHOD OF MANUFACTURING THE SAME, which claims priority to Chinese Patent Application with No. 2021107087190, entitled "MICROCHANNEL HEAT SINK AND METHOD OF MANUFACTURING THE SAME", and filed on Jun. 25, 2021.

TECHNICAL FIELD

The present disclosure relates to the field of heat dissipation of chips, in particular, to a microchannel heat sink and a method of manufacturing the same.

BACKGROUND

The development of electronics towards high integration and high power density leads to increased heat flux density of high power chips such as radio frequency chips and laser chips. Since the demands rise for efficient and stable operation of the chip, a heat sink with high heat dissipation is generally required to dissipate the heat.

At present, common flat heat sink and macro-channel heat sink available on the market are restricted in heat dissipation of the high power density chips, while the microchannel heat sink emerging in recent years has become a research focus due to its excellent heat extraction capacity.

The microchannel heat sink generally refers to liquid cooling heat sink with an internal flow channel width of less than 500 μm. When fluid flows in the microchannel heat sink, it's in an extremely turbulent state with thin thermal boundary layer and low thermal resistance, which has the advantages of fast heat exchange speed and high heat dissipation efficiency, and thus it does better in meeting the heat dissipation requirements of the current high power chips with high heat flux density. The microchannel heat sink is generally made of materials such as silicon, ceramics, and metals. The metal is an ideal material for manufacturing the microchannel heat sink due to its higher thermal conductivity.

In the processing technology for the conventional microchannel heat sink, generally, each plate is firstly processed to have a required pattern, and then a stack of plates is welded together through brazing process, diffusion welding process and other processes to make the heat sink including various complex microchannel structures therein.

However, if the brazing process is used, the brazing filler would easily flow into the channel, which may lead to blockage and weak bonding in some areas. Besides, since the heat sink is required to allow a long-term passage of the cooling fluid during operating, the heat sink is prone to the galvanic corrosion between the internal brazing filler and the plates, which would reduce the reliability of the microchannel heat sink If the diffusion welding process is used, a high pressure needs to be applied to achieve a stronger bonding strength. Due to the soft metal material such as copper or aluminum, the channel will be deformed under high pressure. However, if the applied pressure is not enough, the bonding strength between the plates would be so weak that the microchannel heat sink is prone to leakage during the passage of the cooling fluid.

SUMMARY

Accordingly, it is necessary to provide a method of manufacturing a microchannel heat sink having high interlayer connection reliability, less deformation, and less leakage.

A method of manufacturing a microchannel heat sink includes:
  processing preset inlet and outlet flow channels and a microchannel structure on each of plates constituting the microchannel heat sink;
  preparing an upper cover plate and a lower cover plate, and processing corresponding patterns on the upper cover plate and the lower cover plate according to the microchannel structures of an uppermost plate and a lowermost plate of the microchannel heat sink to be manufactured, respectively;
  aligning and stacking the upper cover plate, the each of the plates, and the lower cover plate in sequence;
  placing the upper cover plate, the each of the plates and the lower cover plate that are aligned and stacked in a reducing atmosphere for heating and heat preservation, and applying a pressure on the upper cover plate and/or the lower cover plate; and
  after applying the pressure for a preset time, stopping the heat preservation and stopping the applying the pressure, and removing the upper cover plate and the lower cover plate.

In one of the embodiments, the method of manufacturing the microchannel heat sink further includes respectively processing positioning holes at corresponding positions of the upper cover plate, the each of the plates, and the lower cover plate. When being aligned and stacked, the upper cover plate, the each of the plates, and the lower cover plate are aligned via the positioning holes.

In one of the embodiments, the positioning holes are distributed at portions of each of the plates near corners thereof, and located in areas other than the preset inlet and outlet flow channels and the microchannel structure on each plate.

In one of the embodiments, the inlet and outlet flow channels and the microchannel structure on the each of the plates are processed by any one of chemical etching, laser cutting, plasma cutting, flame cutting, abrasive cutting, water jet cutting, wire cutting, and CNC machine tool processing, and punching.

In one of the embodiments, the upper cover plate and the lower cover plate are made of a metal or an alloy.

In one of the embodiments, a thickness of the upper cover plate and a thickness of the lower cover plate are not less than a depression depth of the corresponding cover plate when receiving the pressure.

In one of the embodiments, the manufacturing method of the microchannel heat sink further includes providing an easily separable isolation layer between the upper cover plate and a plate adjacent to the upper cover plate and/or between the lower cover plate and a plate adjacent to the lower cover plate.

In one of the embodiments, the easily separable isolation layer is a graphite paper or a graphite liquid.

In one of the embodiments, applying the pressure is realized by placing an upper pressing block and a lower pressing block on opposite sides of the upper cover plate and the lower cover plate away from the stacked plates, respectively, and the upper pressing block and the lower pressing block respectively applying the pressure to the stacked plates through pressing the cover plates, or realized by directly pressing the upper cover plate and the lower cover plate to apply the pressure to the stacked plates.

In one of the embodiments, the applied pressure is in a range of 1 MPa to 20 MPa.

In one of the embodiments, the heating is performed by increasing a temperature to 300° C. to 950° C. at a rate of 30° C./min to 8000° C./min, and a time for the heat preservation is in a range of 120 s to 3600 s.

The present disclosure further provides a microchannel heat sink. The microchannel heat sink is manufactured by the manufacturing method of the microchannel heat sink according to any one of the embodiments.

The above-mentioned method of manufacturing the microchannel heat sink adopts the thermal bonding process to process the microchannel heat sink. By placing the upper cover plate and the lower cover plate on the plates of the microchannel heat sink, the pressure is directly applied, and there is no need to add other adhesives. It can avoid the problems of blockage, galvanic corrosion etc. inside the channel caused by the brazing process, and improve the reliability of the microchannel heat sink product. Before welding, the upper cover plate and the lower cover plate are processed according to the microchannel structure to form a hollow structure, and then aligned and stacked with the microchannel heat sink, and then subjected to pressure welding, which not only accurately and effectively applies the pressure on the walls of the microchannel, but also can greatly relieve the pressure on the microchannel heat sink during the pressure welding process, and reduce the deformation of the cooling liquid channel portion of the microchannel heat sink. Compared with the conventional diffusion welding process, under the same conditions, this process can apply greater pressure to the microchannel heat sink, improve the bonding strength between the plates of the microchannel heat sink and reliability of products.

BRIEF DESCRIPTION OF THE DRAWINGS

For a more complete understanding, reference is now made to the following description taken in conjunction with the accompanying Drawings in which.

ILLUSTRATION FOR REFERENCE SIGNS

100: stacked plates, 101-105: the first plate to the fifth plate, 106: first positioning hole, 107: inlet and outlet flow channels, 108: first microchannel structure, 200: upper cover plate, 201: second positioning hole, 202: second microchannel structure, 300: lower cover plate, 301: third positioning hole, 302: third microchannel structure, 400: finished product of the microchannel heat sink.

DETAILED DESCRIPTION

In order to make the above objects, features and advantages of the present disclosure more clearly understood, specific embodiments of the present disclosure will be described in detail below with reference to the accompanying drawings. In the following description, numerous specific details are set forth in order to provide a thorough understanding of the present disclosure. However, the present disclosure can be implemented in many other ways different from those described herein, and those skilled in the art can make similar improvements without departing from the connotation of the present disclosure. Therefore, the present disclosure is not limited by the specific embodiments disclosed below.

It should be noted that when an element is referred to as being "fixed to" another element, it can be directly on another element or an intermediate element may also be present. When an element is referred to as being "connected to" another element, it can be directly connected to another element or an intermediate element may also be present at the same time.

Unless otherwise defined, all technical and scientific terms used herein have the same meaning as commonly understood by one of ordinary skill in the art to which the present disclosure belongs. The terms used herein in the description of the present disclosure are for the purpose of describing specific embodiments only, and are not intended to limit the present disclosure. As used herein, the term "and/or" includes any and all combinations of one or more of the associated listed items.

Figure 1:
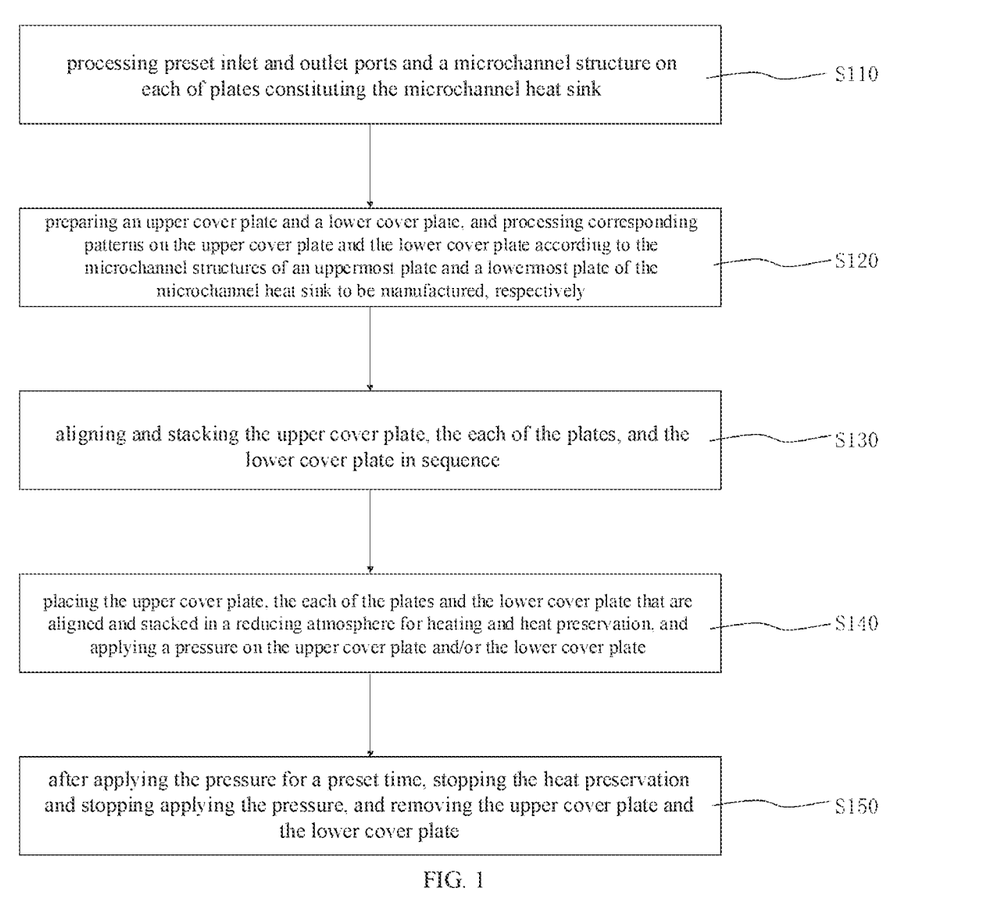
FIG. 1 is a schematic view of a flowchart of a method of manufacturing a microchannel heat sink according to an embodiment of the present disclosure.

As shown in FIG. 1, an embodiment of the present disclosure provides a method of manufacturing a microchannel heat sink, which includes the following steps S110 to S150.

At step S110, preset inlet and outlet flow channels and a microchannel structure are processed on each of plates constituting the microchannel heat sink.

A design of the microchannel structure has a great influence on heat exchange capacity of the microchannel heat sink. The microchannel structure is designed with thermal resistance as the main measurement parameter. The smaller the thermal resistance, the better the heat dissipation performance of the microchannel heat sink. The biggest factor influencing the thermal resistance of the microchannel heat sink is the nature of the coolant. When a chip starts to work, a temperature of a fluid rises to generate the thermal resistance. The greater a flow rate of the fluid, the greater the heat capacity of the fluid and the smaller the thermal resistance value. In addition, the convective thermal resistance caused by thermal convection at an interface between the microchannel and the fluid is also the main part of the thermal resistance of the microchannel. Therefore, the microchannel structures with different patterns can be processed according to the requirements of the thermal resistance of a heat exchanger. Specifically, a plurality of plates can also be stacked to further enhance the heat dissipation effect. The pattern of the microchannel structure of each of the plates can be designed according to requirements, which can be the same as that of other plates or different from that of other plates. For example, the microchannel heat sink can be, but not limited to, be designed to have a five-layer fold-back structure.

At step S120, an upper cover plate and a lower cover plate are prepared, and corresponding patterns are processed on the upper cover plate and the lower cover plate according to the microchannel structures of the uppermost plate and the lowermost plate of the microchannel heat sink to be manufactured, respectively.

The upper cover plate and the lower cover plate are processed to have the corresponding patterns according to the microchannel structures of the uppermost and the lowermost plates of the heat sink to be manufactured. When pressure is applied, since the upper cover plate has the same pattern as that of the plate attached thereto and the lower cover plate has the same pattern as that of the plate attached thereto, the upper cover plate and the lower cover plate will not apply a pressure on the plates of the microchannel heat sink to be manufactured at the channel structure, so that the damage of the pressure to the microchannel structure of the plate can be reduced, and each of the plates of the microchannel heat sink can withstand greater pressure to make the lamination tighter.

At step S130: the upper cover plate, each of the plates, and the lower cover plate are aligned and stacked in sequence.

Each of the plates needs to be aligned and stacked according to the design of the structure of the microchannel heat sink, and the microchannel structure of each of the plates is required to correspond to the preset structure to achieve the preset heat dissipation effect. If they are not stacked neatly, it is disadvantage for the sufficient heat dissipation when the heat sink is working. Further, the upper cover plate and each of the plates, as well as the each of the plates and the lower cover plate, need to be aligned and stacked in sequence to ensure that hollow structures of the upper cover plate and the lower cover plate correspond to the microchannel structures of the uppermost plate and the lowermost plate during laminating, which can effectively disperse the pressure of the cover plates on each of the plates, and avoid damage to each of the plates caused by excessive pressure when the pressure is applied.

At step S140, the upper cover plate, each of the plates, and the lower cover plate that are aligned and stacked are placed in a reducing atmosphere for heating and heat preservation, and a pressure is applied on the upper cover plate and/or the lower cover plate.

Hydrogen can be used but not limited to be introduced as the reducing atmosphere to ensure that each of the plates will not be oxidized during the laminating process. At different temperatures and pressures, the diffusion speed of atoms between the plates is different. The higher the temperature, the greater the pressure, the faster the diffusion speed of atoms between the plates, and the tighter the lamination of the plates. When the heat preservation is performed for a period of time, it can ensure that each of the plates is fully laminated.

At step S150, after the pressure is applied for a preset time, the heat preservation and the applying the pressure are stopped, and the upper cover plate and the lower cover plate are removed.

When the pressure is applied to the microchannel heat sink for the set time, the lamination is finished, and it is possible but not limited to take out the upper cover plate, each of the plates, and the lower cover plate that are laminated after cooling. The upper cover plate and the lower cover plate are used as isolation plates to assist the safe lamination of the plates, and are removed after the lamination is finished. The laminated plates are processed into the finished product of the microchannel heat sink.

The method of manufacturing the microchannel heat sink according to the present disclosure adopts the processing technology of thermal bonding, that is, the components of the microchannel heat sink to be manufactured after subjected to surface treatment are tightly attached together without other adhesives, and are directly placed in a furnace at a high temperature for heating and pressure welding. After being laminated, the plates of the microchannel heat sink are firmly bonded together.

In a specific example, the above-mentioned method of manufacturing the microchannel heat sink further includes the step of respectively processing positioning holes at corresponding positions of the upper cover plate, each of the plates, and the lower cover plate. When being aligned and stacked, the upper cover plate, each of the plates, and the lower cover plate are aligned via the positioning holes. The positioning holes are used to ensure that the upper cover plate, each of the plates, and the lower cover plate are stacked neatly, and the positions of the upper cover plate, each of the plates, and the lower cover plate correspond to each other, which is convenient for accurate welding.

Optionally, the positioning holes are distributed at portions of each plate near the corners thereof, and located in areas other than the preset inlet and outlet flow channels and the microchannel structure on each plate. Since these positioning holes are not part of the inlet and outlet flow channels and the structure of the microchannel heat sink, the positioning holes are located at the portions of each plate near the corners thereof, so that when the welding is finished, the redundant portions such as the positioning holes can be cut off by cutting. The positions of the positioning holes can be designed according to the structure of the microchannel heat sink to be manufactured, and are not limited to the portions of each plate near the corners. It can be understood that, in other specific examples, specific holes on the microchannel structure can also be used as the positioning holes for positioning. In this way, there is no need to additionally process the positioning holes, and there is no need to additionally cut the positioning holes.

The number, sizes and shapes of the positioning holes can be designed according to the specific product manufacturing requirements. For example, the number of the positioning holes can be, but not limited to 2~4, an inner diameter of the positioning hole can be, but not limited to 2 mm~4 mm, and the shape of the positioning hole can be, but not limited to, a circular hole. As long as the structure of the microchannel heat sink itself is not affected, there is no limitation on the number, sizes, and positions of the positioning holes.

In a specific example, the inlet and outlet flow channels and the microchannel structure on each of the plates can be processed by, but not limited to, any one of chemical etching, laser cutting, plasma cutting, flame cutting, abrasive cutting, water jet cutting, wire cutting, and computer numerical control (CNC) machine tool processing, and punching. Each of the plates is a metal or alloy with good thermal conductivity. After the microchannel structure is designed, any one of the above processing methods can be used to quickly process the inlet and outlet flow channels and the microchannel structure. Optionally, the chemical etching can be used for processing. The chemical etching is suitable for processing most metals and alloys, and has high processing precision, no stress and no burrs are generated during processing, and the processing cost is relatively low, and this process is flexible, and has no effect on the structure and properties of the microchannel heat sink.

Optionally, in a specific example, each of the plates is required to be subjected to surface cleaning treatment before and after processing. If the metal plate is exposed to the air for a long time, there will be foreign objects, dirt and oxides on its surface. For example, the oil and the oxide film on the surface of the metal plate can be removed by acid cleaning, and then the plate can be thoroughly cleaned by clean water, and the cleaning method is not limited to herein.

In a specific example, the upper cover plate and the lower cover plate are made of metal or alloy. In order to ensure that the plates of the microchannel heat sink can be tightly and firmly laminated by thermal bonding, high temperature and high pressure are required during laminating. Therefore, the upper cover plate and the lower cover plate are made of materials having high temperature resistance and higher strength, which can ensure that the upper cover plate and the lower cover plate will not be deformed and cracked during the thermal bonding process at high temperature and high pressure, and ensure that a destructive effect is not generated on the plates of the microchannel heat sink. For example, the upper cover plate and the lower cover plate can be made of, but not limited to, any one of iron, cobalt, chromium, nickel, tungsten, molybdenum, aluminum, titanium and other metals and alloys thereof. Further, for example, the upper cover plate and the lower cover plate can be made of, but not limited to, any one of GH4169 nickel base alloy, Ti-18 (Ti-6Al-4Mo-4Zr-2Sn-1W-0.2Si) titanium base alloy, Inconel 718. In addition, the upper cover plate and the lower cover plate can also be made of, but not limited to, any one of $Al_2O_3$, AlN ceramic, graphite plate, and SiC.

In a specific example, the thickness of the upper cover plate and the thickness of the lower cover plate are not less than the depression depth of the corresponding cover plate when receiving the pressure. The thickness of the upper cover plate and the lower cover plate is also one of the important factors to ensure the safety of the thermal bonding process. The thickness of the upper cover plate and the lower cover plate being not less than the depression depth of the corresponding cover plate when receiving the pressure can further ensure that the cover plate will not be deformed or not affect the structure of the plate during the laminating process. Specifically, the thickness is not less than 0.08 mm.

In a specific example, the method further includes a step of providing an easily separable isolation layer between the upper cover plate and the plate adjacent to the upper cover plate and/or between the lower cover plate and the plate adjacent to the lower cover plate. After the lamination is finished, the plates should be separated from the upper cover plate and the lower cover plate. In order to ensure that the upper cover plate and the lower cover plate are not difficult to be removed due to the too tight attachment to the plates during the laminating process, the easily separable isolation layer is provided, to facilitate the separation of the upper cover plate and the lower cover plate from the plates.

In a specific example, the easily separable isolation layer may be, but not limited to, a graphite paper or a graphite liquid.

In a specific example, applying the pressure may be realized by placing an upper pressing block and a lower pressing block on the opposite sides of the upper cover plate and the lower cover plate away from the stacked plates, respectively, and the upper pressing block and the lower pressing block respectively applying the pressure to the stacked plates through pressing the cover plates, or realized by directly pressing the upper cover plate and the lower cover plate to apply the pressure to the stacked plates. When the pressure is directly applied, the upper cover plate and the lower cover plate are made of the same material as that of the upper pressing block and the lower pressing block. In this case, the upper cover plate and the lower cover plate can function as both cover plate and pressing block.

In a specific example, the applied pressure is in a range of 1 MPa to 20 MPa. The amount of the applied pressure is related to the material of each plate and the design of the microchannel structure. For example, the applied pressure can be 3 MPa, 5 MPa, 10 MPa, and 15 MPa. The same pressure can be applied in the whole process of applying pressure, or the pressure can be applied adjustably in the range of 1 MPa to 20 MPa at different time period according to the laminating degree of thermal bonding.

In a specific example, the heating is performed by rapidly increasing the temperature to 300° C. to 950° C. at a rate of 30° C./min to 8000° C./min, and the time for the heat preservation is in a range of 120 s to 3600 s. The heating is performed to rapidly increase the laminating temperature for pressure welding, and the heat preservation is performed for a period of time, which can ensure sufficient laminating. Preferably, the temperature is rapidly increased to 500° C. to 900° C. at a rate of 2000° C./min to 6000° C./min, and the time for the heat preservation is in a range of 600 s to 1800 s.

After the pressure is applied, the upper cover plate, the each of the plates, and the lower cover plate that have been laminated are taken out. Optionally, the upper cover plate, each of the plates, and the lower cover plate may not be taken out from a heating furnace until they are cooled to room temperature. The upper cover plate and the lower cover plate are removed, and the stacked plates subjected to the lamination are cut into a finished product of the microchannel heat sink.

Further, the present disclosure further provides a microchannel heat sink, which is manufactured by the method of manufacturing the microchannel heat sink according to any of the above specific examples.

First Embodiment

The microchannel heat sink and the method of manufacturing the same according to the present disclosure are further described in detail below by taking the manufacture of a five-layer fold-back microchannel heat sink as an example. It can be understood that, the method of manufacturing the microchannel heat sink of the present disclosure is not limited to manufacturing the following five-layer fold-back microchannel heat sink.

The method of manufacturing the five-layer fold-back microchannel heat sink according to the first embodiment below includes the following steps 1 to 5.

Figure 2:
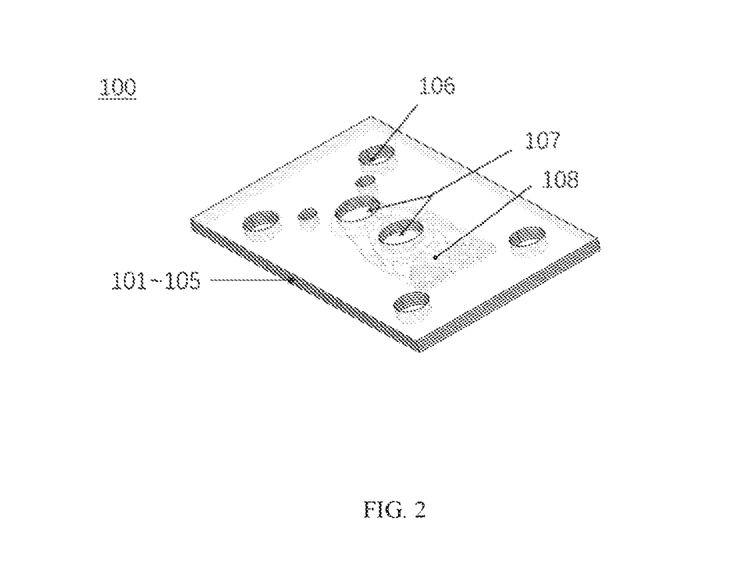
FIG. 2 is a schematic view of stacked plates of a five-layer fold-back microchannel heat sink to be manufactured according to a first embodiment.

At step 1, as shown in FIG. 2, preset inlet and outlet flow channels 107 and a first microchannel structure 108 are processed on a first plate 101 to a fifth plate 105 constituting the microchannel heat sink.

A microchannel pattern of each of the plates is firstly designed, and then the inlet and outlet flow channels 107 and the first microchannel structure 108 are processed according to the designed pattern by chemical etching, and four circular holes with an inner diameter of 3 mm are processed in areas on each plate, other than the preset inlet and outlet flow channels 107 and the first microchannel structure 108, at portions of the five plates near the corners thereof, as the first positioning holes 106.

Figure 3:
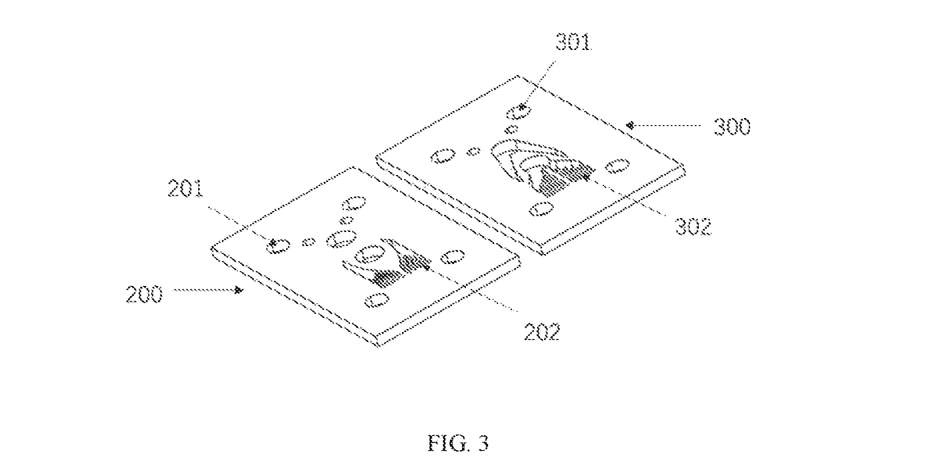
FIG. 3 is a schematic view of an upper cover plate and a lower cover plate according to the first embodiment.

At step 2, as shown in FIG. 3, the upper cover plate 200 and the lower cover plate 300 are prepared, and the corresponding patterns are processed on the upper cover plate 200 and the lower cover plate 300, respectively, according to the first microchannel structures 108 of the uppermost plate and the lowermost plate of the microchannel heat sink to be manufactured.

A molybdenum material with a thickness of 0.1 mm is used as the material of the upper cover plate 200 and the lower cover plate 300. According to the first microchannel structures 108 of the uppermost layer and the lowermost layer of the microchannel heat sink to be manufactured, a corresponding second microchannel structure 202 and a third microchannel structure 302 are processed on the upper cover plate 200 and the lower cover plate 300, respectively, and four circular holes with an inner diameter of 3 mm are processed at the portions adjacent to the corners and at the positions corresponding to the first plate 101 to the fifth plate 105, as second positioning holes 201 and third positioning holes 301.

Figure 4:
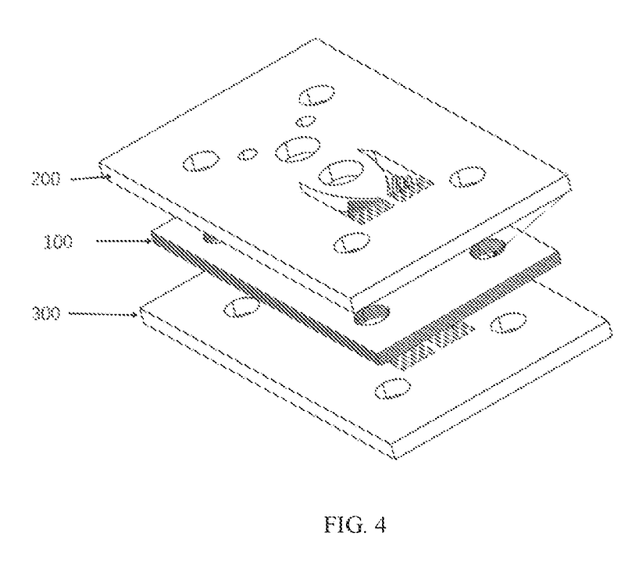
FIG. 4 is a schematic view of an assembly order of the five-layer fold-back microchannel heat sink to be manufactured when laminated according to the first embodiment.

At step 3, as shown in FIG. 4, the upper cover plate 200, the first plate 101 to the fifth plate 105, and the lower cover plate 300 are aligned and stacked in sequence.

After the first plate 101 to the fifth plate 105 processed in step 1, and the upper cover plate 200 and the lower cover plate 300 processed in step 2 are subjected to surface treatment by acid cleaning and water cleaning, the upper cover plate 200, the first plate 101 to the fifth plate 105, and the lower cover plate 300 are stacked in sequence. One layer of graphite paper is added between the upper cover plate 200 and the stacked plates 100 and between the lower cover plate 300 and the stacked plates 100, respectively. Then, the upper cover plate 200, the stacked plates 100, and the lower cover plate 300 are positioned and aligned in sequence according to the second positioning holes 201, the first positioning holes 101, and the third positioning holes 301.

At step 4, the upper cover plate 200, the first plate 101 to the fifth plate 105, and the lower cover plate 300 that are aligned and stacked are placed in a reducing atmosphere for heating and heat preservation, and a pressure is applied on the upper cover plate 200 and the lower cover plate 300.

The upper cover plate 200, the stacked plates 100, and the lower cover plate 300 that are aligned and stacked are placed into the heating furnace, and an upper pressing block and a lower pressing block are placed on the opposite sides of the upper cover plate 200 and the lower cover plate 300 away from the stacked plates 100, respectively. The heating furnace is evacuated, and hydrogen gas is introduced into the heating furnace to provide the reducing atmosphere. A pressure of 10 MPa is applied to the upper pressing block and the lower pressing block. The pressure is applied on the stacked plates 100 through pressing the upper cover plate 200 and the lower cover plate 300 by the pressing blocks. The heating furnace is rapidly heated to 850° C. at a rate of 200° C./min during applying the pressure, and then the heat preservation is performed for 2400 s.

Figure 5:
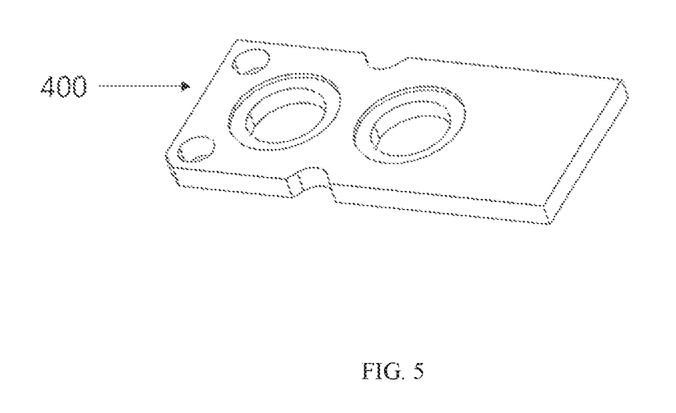
FIG. 5 is a schematic view of a finished product of the five-layer fold-back microchannel heat sink according to the first embodiment.

At step 5, after the pressure is applied for a preset time, the heat preservation and applying the pressure are stopped, and the upper cover plate 200 and the lower cover plate 300 are removed.

As shown in FIG. 5, after the preset time is reached, the heat preservation and the applying the pressure are stopped. After the heating furnace is naturally cooled to room temperature, the heating furnace is opened, and the upper cover plate 200, the stacked plates 100, and the lower cover plate 300 that are laminated are taken out. The upper cover plate 200 and the lower cover plate 300 are removed, and then the stacked plates 100 that are laminated are cut and processed to form the finished product 400 of the microchannel heat sink.

The above-mentioned method of manufacturing the microchannel heat sink adopts the thermal bonding process to process the microchannel heat sink. By placing the upper cover plate and the lower cover plate on the plates of the microchannel heat sink, the pressure is directly applied, and there is no need to add other adhesives. It can avoid the problems of blockage, galvanic corrosion etc. inside the channel caused by the brazing process, and improve the reliability of the microchannel heat sink product. Before welding, the upper cover plate and the lower cover plate are processed according to the microchannel structure to form a hollow structure, and then aligned and stacked with the microchannel heat sink, and then subjected to pressure welding, which not only accurately and effectively applies the pressure on the walls of the microchannel, but also can greatly relieve the pressure on the microchannel heat sink during the pressure welding process, and reduce the deformation of the cooling liquid channel portion of the microchannel heat sink. Compared with the conventional diffusion welding process, under the same conditions, this process can apply greater pressure to the microchannel heat sink, improve the bonding force between the plates of the microchannel heat sink and improve product stability.

The technical features of the above-described embodiments can be combined arbitrarily. To simplify the description, not all possible combinations of the technical features in the above embodiments are described. However, all of the combinations of these technical features should be considered as being fallen within the scope of the present disclosure, as long as such combinations do not contradict with each other.

The foregoing embodiments merely illustrate some embodiments of the present disclosure, and descriptions thereof are relatively specific and detailed. However, it should not be understood as a limitation to the patent scope of the present disclosure. It should be noted that, a person of ordinary skill in the art may further make some variations and improvements without departing from the concept of the present disclosure, and the variations and improvements falls in the protection scope of the present disclosure. Therefore, the protection scope of the present disclosure shall be subject to the appended claims.

What is claimed is:

1. A method of manufacturing a microchannel heat sink, comprising:
    processing preset inlet and outlet flow channels and a microchannel structure on each of plates constituting the microchannel heat sink;
    preparing an upper cover plate and a lower cover plate, and processing corresponding patterns on the upper cover plate and the lower cover plate according to the microchannel structures of an uppermost plate and a lowermost plate of the microchannel heat sink to be manufactured, respectively;
    aligning and stacking the upper cover plate, the each of the plates, and the lower cover plate in sequence;
    placing the upper cover plate, the each of the plates, and the lower cover plate that are aligned and stacked in a reducing atmosphere for heating and heat preservation, and applying a pressure on the upper cover plate and/or the lower cover plate; and
    after applying the pressure for a preset time, stopping the heat preservation and stopping the applying the pressure, and removing the upper cover plate and the lower cover plate.

2. The method of manufacturing the microchannel heat sink according to claim 1, further comprising respectively processing positioning holes at corresponding positions of the upper cover plate, the each of the plates, and the lower cover plate,
  wherein when being aligned and stacked, the upper cover plate, the each of the plates, and the lower cover plate are aligned via the positioning holes.

3. The method of manufacturing the microchannel heat sink according to claim 2, wherein the positioning holes are distributed at portions of each of the plates near corners thereof, and located in areas other than the preset inlet and outlet flow channels and the microchannel structure on each plate.

4. The method of manufacturing the microchannel heat sink according to claim 1, wherein the inlet and outlet flow channels and the microchannel structure on the each of the plates are processed by any one of chemical etching, laser cutting, plasma cutting, flame cutting, abrasive cutting, water jet cutting, wire cutting, computer numerical control (CNC) machine tool processing, and punching.

5. The method of manufacturing the microchannel heat sink according to claim 1, wherein the upper cover plate and the lower cover plate are made of a metal or an alloy.

6. The method of manufacturing the microchannel heat sink according to claim 1, wherein a thickness of the upper cover plate and a thickness of the lower cover plate are not less than a depression depth of the corresponding cover plate when receiving the pressure.

7. The method of manufacturing the microchannel heat sink according to claim 1, further comprising providing an easily separable isolation layer between the upper cover plate and a plate adjacent to the upper cover plate and/or between the lower cover plate and a plate adjacent to the lower cover plate.

8. The method of manufacturing the microchannel heat sink according to claim 7, wherein the easily separable isolation layer is a graphite paper or a graphite liquid.

9. The method of manufacturing the microchannel heat sink according to claim 1, wherein applying the pressure is realized by placing an upper pressing block and a lower pressing block on opposite sides of the upper cover plate and the lower cover plate away from the stacked plates, respectively, and the upper pressing block and the lower pressing block respectively applying the pressure to the stacked plates through pressing the cover plates, or realized by directly pressing the upper cover plate and the lower cover plate to apply the pressure to the stacked plates.

10. The method of manufacturing the microchannel heat sink according to claim 1, wherein the applied pressure is in a range of 1 MPa to 20 MPa.

11. The method of manufacturing the microchannel heat sink according to claim 1, wherein the heating is performed by increasing a temperature to 300° C. to 950° C. at a rate of 30° C./min to 8000° C./min, and a time for the heat preservation is in a range of 120 s to 3600 s.

* * * * *